(12) United States Patent
Fastow et al.

(10) Patent No.: US 6,438,037 B1
(45) Date of Patent: Aug. 20, 2002

(54) THRESHOLD VOLTAGE COMPACTING FOR NON-VOLATILE SEMICONDUCTOR MEMORY DESIGNS

(75) Inventors: Richard Fastow, Cupertino; Xin Guo, Mountain View; Sameer S. Haddad, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/851,773

(22) Filed: May 9, 2001

(51) Int. Cl.[7] .............................................. G11C 16/06
(52) U.S. Cl. .............................. 365/185.22; 365/185.3
(58) Field of Search ........................ 365/185.22, 185.24, 365/185.29, 185.3, 185.14, 185.19

(56) References Cited

U.S. PATENT DOCUMENTS 5,467,306 A * 11/1995 Kaya et al. ............... 365/185.2
5,576,992 A * 11/1996 Mehrad ................... 365/185.24
6,252,803 B1 * 6/2001 Fastow et al. ........... 365/185.22

* cited by examiner

Primary Examiner—Richard Elms
Assistant Examiner—Anh Phung
(74) Attorney, Agent, or Firm—Eschweiler & Associates, LLC

(57) ABSTRACT

A flash memory design with a compact threshold voltage distribution and a method for compacting the threshold voltage for a flash memory design in which the threshold voltage is compacted by erasing a plurality of memory cells to set the threshold voltage for the memory cells substantially towards a median erased threshold voltage; verifying at least one fast-erase memory cell; selectively soft-programming the memory cells; and erasing subsequent to selectively soft-programming.

10 Claims, 4 Drawing Sheets

THRESHOLD VOLTAGE COMPACTING FOR NON-VOLATILE SEMICONDUCTOR MEMORY DESIGNS

BACKGROUND OF THE INVENTION

1. Field of the Invention

The present invention relates generally to the field of electronic data storage devices. More particularly, the present invention relates to non-volatile semiconductor memory devices having a compact threshold voltage distribution and a method for compacting the threshold voltage distribution for non-volatile semiconductor memory designs.

2. Description of the Related Art

Electronic data storage designs, referred to as memory, are used to store computer programs executed by an electronic processor and/or store logical data operated on by the processor to achieve the functionality of an electronic device. Semiconductor memory designs that do not require ambient power to store electronic data, commonly referred to as "non-volatile" semiconductor memory devices, have been developed. Flash memory is a specific form of non-volatile memory by which bits of logical data are stored in units of memory termed memory cells. A grouping of memory cells is termed a word, a grouping of words termed a page, and a grouping of pages termed a sector. Data is accessed for reading and programming by word or page, while an entire sector must be accessed for erasing. In general, the flash memory is arranged into columns and rows of memory cells, each column representing a bitline of a data.

A typical memory cell in a flash memory device includes a transistor characterized by a programmable threshold voltage $V_t$. The transistor's threshold voltage can be set, or programmed, to a desired value along an analog scale between maximum and minimum threshold voltage limits that are determined based on the design parameters for the transistor. In one example, a flash memory cell has a discrete Metal-Oxide-Semiconductor ("MOS") field effect transistor having a source, a drain, a floating gate, a control gate and a p-well substrate material. In conventional flash memory designs, known as NOR memory, the memory cells are arranged in an array of rows and columns, with the control gates of the transistors comprising a row being electrically coupled to a respective word-line and the drains comprising a column being electrically coupled to a respective bit-line. The sources of each memory cell are electrically coupled to each other.

Voltages can be applied to the transistor for setting the $V_t$ to represent logical value "1" or "0," for reading the data stored in the memory cell, for verifying that the cell is programmed, for verifying that the cell is erased, and for verifying that the cell is not overerased. When a voltage sufficiently exceeding the $V_t$ is applied to the control gate, the transistor turns on and can be caused to conduct substantial current. Conversely, when a voltage applied to the gate does not sufficiently exceed the $V_t$, the transistor will remain in an off state and will not conduct substantial current. In typical flash memory designs, the on state represents a logical "1" while the off state represents a logical "0." For example, during a read cycle of a programmed memory cell, the voltage applied to the gate is not greater than $V_t$ and the memory cell will not conduct current. In comparison, an erased memory cell will conduct current during a read cycle because the gate voltage is greater than $V_t$. Thus a programmed memory cell represents logical "0," while and erased memory cell represents logical "1."

In one example of a floating gate cell, the transistor is programmed by biasing the transistor in a manner to cause injection of electrons into the floating gate, and erased by biasing the transistor in a manner to cause electrons to evacuate the floating gate. In an example of a non-floating gate cell, a transistor with a thin insulating film between the substrate and control gate is programmed by biasing the transistor in a manner to cause injection of electrons to the thin insulating film, and erased by causing electrons to evacuate the thin insulating film. In general, electrons injected into the floating gate or the thin insulating film raises the $V_t$, while evacuation of electrons decreases the $V_t$.

By way of example, programming of the memory cell occurs by biasing the memory cell such that 9V is applied to the control gate, 5V is applied to the drain and the source is grounded (0V). This configuration causes electrons to be injected from the drain depletion region into the floating gate. After the memory cell is programmed the injected electrons are trapped, creating a negative charge that increases the $V_t$ of the memory cell. By way of example, a programmed memory cell has a $V_t$ greater than approximately 5V.

In one arrangement for reading data, the memory cell is biased by applying 5V to the word-line to which the control gate of the cell is connected, applying 1V to the bit-line to which the drain is connected, grounding the source, and sensing data on the bit-line. When data is read from a programmed memory cell, wherein $V_t$ is set relatively high (5V), the bit-line to which it is electrically coupled will not conduct substantial current. In comparison, when data is read from an erased memory cell, wherein $V_t$ is set relatively low, the control gate voltage creates a channel in which relatively high current will conduct on the bit line to which the erased memory cell is electrically coupled.

Erasure of data is caused by a process in which the transistor is biased in a manner to cause electrons to evacuate the floating gate or the thin insulating film, or by injection of holes into these regions. An erase voltage is applied at sufficient value and for a sufficient duration to lower the transistor's threshold voltage below that of a predetermined voltage, often referred to as the erase-verify voltage ("$V_{cv}$"). The erase-verify voltage is sufficiently less than the voltage applied during the read cycles $V_t$ so that an erased transistor will conduct current during a read cycle. In one arrangement for erasing, a relatively high voltage, typically 12V, is applied to the source while the gate is grounded and the drain is floating. This arrangement causes electrons to undergo Fowler-Nordheim tunneling from the floating gate towards the source. In another arrangement, the memory cell is biased with a negative voltage substantially on the order of −10V applied to the control gate while +10V is applied to the source and the drain is floating. In a further arrangement, 5V is applied to a P-well and −10V is applied to the control gate while the source/drain are floating. Although present flash memory designs can be erased at the sector level and can be programmed at the word level, it will be appreciated that the granularity by which a flash memory device can be programmed or erased may vary and that granularities down to the bit level are contemplated.

During erasure of a flash memory, the threshold voltage of each memory cell is verified to have a value less than the erase verify voltage. Because of variations in the physical and electrical characteristics of the memory cells, the rate that a memory cell erases can vary. Design variables such as channel length and width affect how fast a transistor can be erased. Because each memory cell is subjected to substantially the same erase voltage pulse, some memory cells erase faster than others. Fast-erase memory cells can overerase, having a lower threshold voltage than a slow-erase memory cell. The erased memory cells collectively form a threshold voltage distribution with the fast-erase memory cells having a relatively low threshold voltage, slow-erase memory cells having a threshold voltage closer to the erase verify voltage and typical memory cells having a median erased threshold voltage. A typical distribution will be centered about the median threshold voltage.

An overerased memory cell exhibits behavior similar to a depletion mode type transistor that cannot be turned off by normal operating voltages applied to the control gate, and may introduce leakage currents during subsequent program and read operations. Furthermore, a transistor with an undesirably low threshold voltage will have a larger sub-threshold current, also adding to the leakage current. Excessive leakage currents have adverse effects on the operation of the flash memory. For example, the leakage currents of multiple cells in a column have a summing effect of leakage current on the bit-line, and may result in an incorrect data reading. During programming, high column leakage due to cells having a high drain induced barrier lowering and/or a low erased threshold voltage, will result in large programming currents. Advanced Flash memory designs, utilizing shorter channel lengths, have been somewhat limited by drain induced barrier lowering and leakage currents of fast erase memory cells. As a result, minimizing the amount of low threshold voltage erased memory cells is desirable.

Accordingly, there is a need for providing a compact erased threshold voltage distribution for non-volatile semiconductor memory designs.

BRIEF SUMMARY OF THE INVENTION

By way of introduction only, the present invention provides a method and apparatus for compacting a threshold voltage distribution of erased memory cells in a flash memory array. A flash memory array having a compact threshold voltage distribution will have reduced sub-threshold-voltage currents.

An illustrated example for a device of the present invention comprises a flash memory device having a plurality of memory cells configured to electronically store logical data and a circuitry electrically coupled to the memory cells configured to selectively soft program erased memory cells. The flash memory device is also configured to erase the memory cells subsequent to soft-programming. The memory cells are generally characterized as having a variable threshold voltage which can be set to one of at least two states: 1) an erased state, and 2) a programmed state. Erased memory cells have a threshold voltage set below a voltage limit, commonly referred to as an erase-verify voltage.

In general, erasing a memory cell comprises applying a voltage to the memory cell to lower its threshold voltage, while programming is designed to raise the threshold voltage. Because of variations in construction, memory cells will erase at various rates, with the fast-erase memory cells set to a lower threshold voltage than slow-erase memory cells. In an array of erased flash memory cells, many of the memory cells will have a threshold voltage substantially that of a median erase threshold voltage, fast erase memory cells will have a substantially lower threshold voltage, while slow erase memory cells will have a greater threshold voltage. A soft-programming circuit electrically coupled to the memory array is configured to apply soft-programming to memory cells having a threshold voltage less than a selected reference voltage. The selected reference voltage is chosen so that fast erase memory cells will be soft-programmed. Soft-programming, or partial programming, sets the threshold voltage of the fast erase cells to a value greater than the selected reference voltage. Subsequent to selectively soft-programming of the fast erase memory cells, the plurality of memory cells can then be erased in a manner known in the art. The device may then undergo another soft-program step using a second reference voltage level, if required. The resulting array has a compact erased threshold voltage distribution with the median erased threshold voltage greater than a non-compacted flash memory array. Accordingly, the device of the present invention provides an erased flash memory array with a higher median threshold voltage and fast erase bits having a higher threshold voltage than in a flash memory having conventionally erased memory cells.

An illustrated example for a method of the present invention provides for compacting a threshold voltage distribution for a flash memory design having a plurality of erased memory cells. The method includes selectively soft-programming a plurality of fast erased bits having a threshold voltage less than a selected reference voltage and subsequent to selectively soft-programming the memory cells, erasing the plurality of memory cells. The fast-erase bits may be soft-programmed again, using a second reference voltage level as required, to ensure a compacted erased threshold voltage distribution.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Hereinafter embodiments of the present invention will be explained with reference to the accompanying figures.

The illustrated embodiments provide a fast and accurate system for compacting a threshold voltage ("$V_t$") distribution for a non-volatile semiconductor memory. In particular, the illustrated embodiments provide a device capable of and a method for reducing column leakage current during programming and reading a flash memory array comprising a plurality of memory cells. The illustrated embodiments are particularly related to flash memory cells displaying short channel behavior (i.e. high drain-induced barrier lowering), or to arrays having a low erase verify voltage.

The preferred embodiments of the present invention will hereinafter be explained with reference to FIGS. 1–5.

Figure 1:
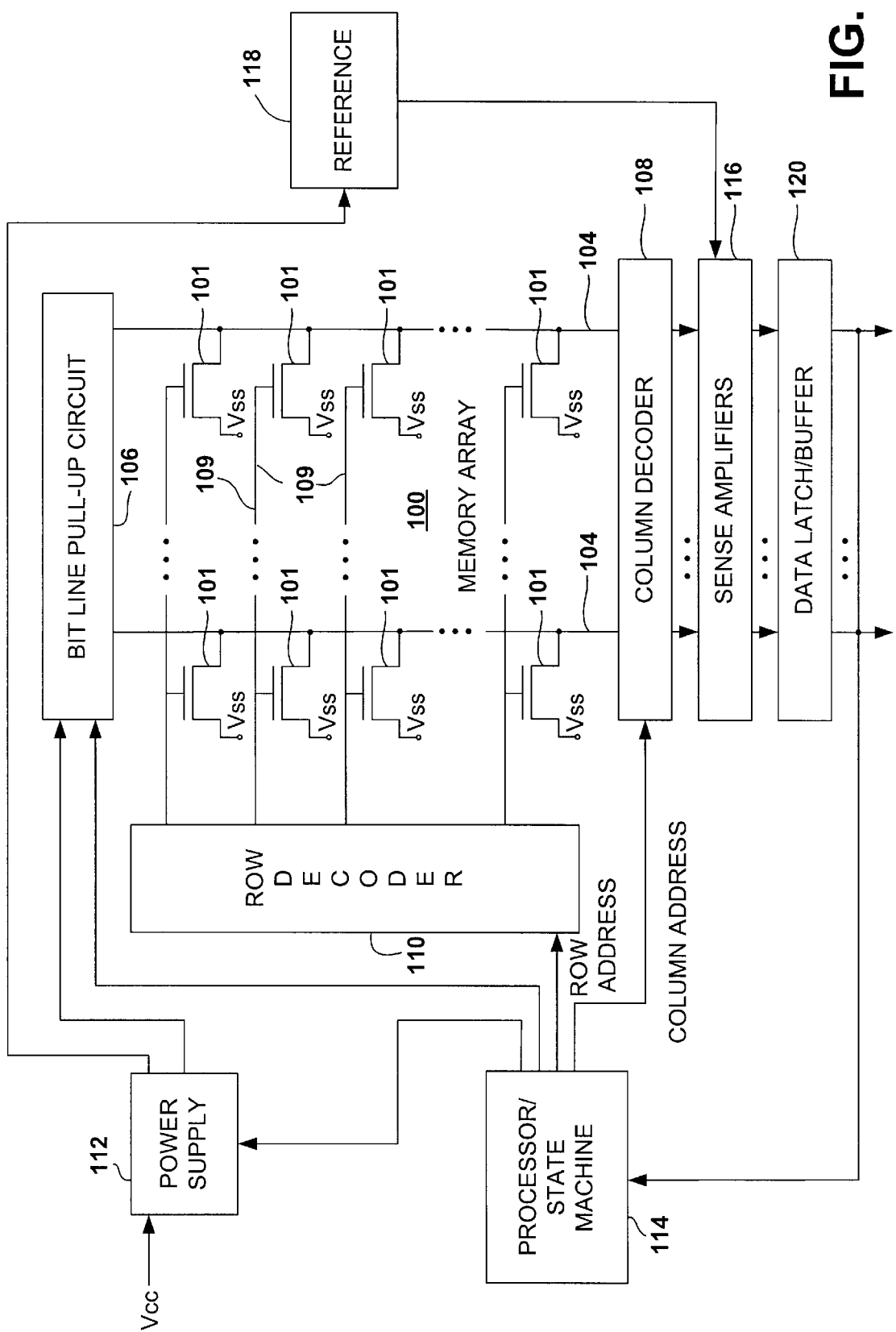
FIG. 1 is a schematic illustration of one embodiment of an integrated circuit with a flash memory array.

FIG. 1 illustrates an example of a typical configuration for an integrated circuit including a flash memory array 100 and circuitry electrically coupled to the flash memory array enabling programming, soft-programming, erasing, and reading data stored in the flash memory array 100. The integrated circuit may be any integrated circuit manufactured in any suitable technology. In the illustrated embodiment, the integrated circuit includes a memory array 100 comprising a plurality of memory transistors 101, a bit-line 104, a bit-line pull-up circuit 106, a column decoder 108, a word-line 109, a row decoder 110, a power supply 112, a processor/state machine 114, sense amplifiers 116, a voltage reference 118, and a data latch/buffer 120. The flash memory array 100 comprises individual memory transistors 101, in which bits of logical data ("0" or "1") are stored. Each memory transistor 101 has a drain connected to a bit-line 104 and each bit-line 104 is connected to the bit-line pull up circuit 106 and the column decoder 108. The sources of the memory transistors 101 are connected to $V_{ss}$, while their gates are each connected by a word-line 109 to a row decoder 110.

The row decoder 110 receives voltage signals from a power supply 112 and distributes the particular voltage signals to the word-lines as controlled by a row address received from a processor or state machine 114. Likewise, the bitline pull up circuit 106 receives voltage signals from the power supply 112 and distributes the particular voltage signals to the bitlines as controlled by a signal from the processor 114. Voltages provided by the power supply 112 are provided as controlled by signals received from processor 114.

The column decoder 108 provides signals from particular bitlines 104 to sense amplifiers or comparators 116 as controlled by a column address signal received from processor 114. The sense amplifiers 116 further receive voltage reference signals from reference 118. The outputs from sense amplifiers 116 are then provided through data latches or buffers 120 to processor 114.

The memory array 100 is arranged in a plurality of "M" memory sectors with each memory sector having "N" memory transistors 101. Within each sector, the memory transistors 101 are arranged into segments termed a page. In a conventional flash memory array 100, data stored in memory transistors 101 can be accessed for reading and programming by word level while an entire sector must be accessed for erasing. Those skilled in the art will recognize that the granularity by which a flash memory device can be read, programmed, or erased may vary. Granularities down to the bit level and up to the page level are contemplated.

In the illustrated embodiment, programming and soft-programming of the flash memory array 100 is executed on the word level. The word-line 109 is associated with the row address. The word-line will cross multiple bit-lines 104. The bit-line 104 is associated with the column address. Each bit-line 104 contains buffer logic to interface to the selected cell during program, soft-program, read, and erase operations.

Figure 2A:
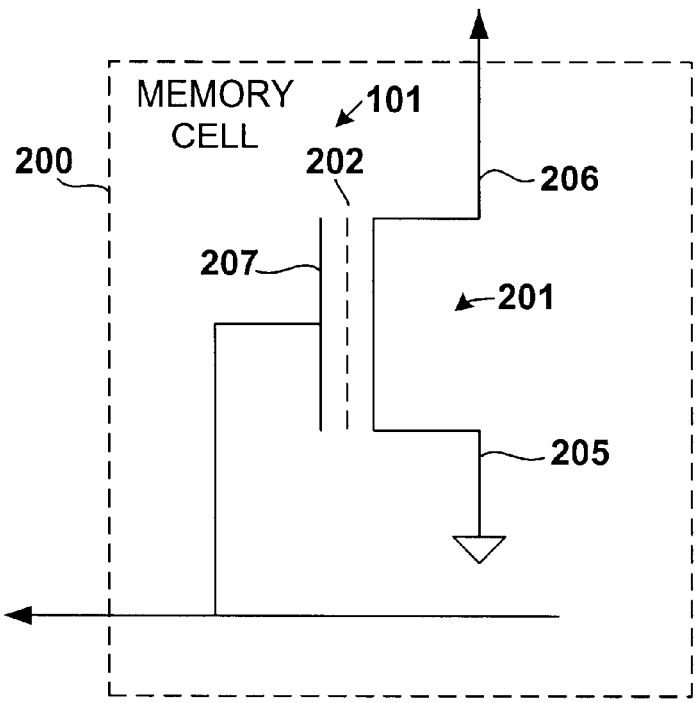
FIG. 2a is a schematic diagram that illustrates a memory cell.
Figure 2B:
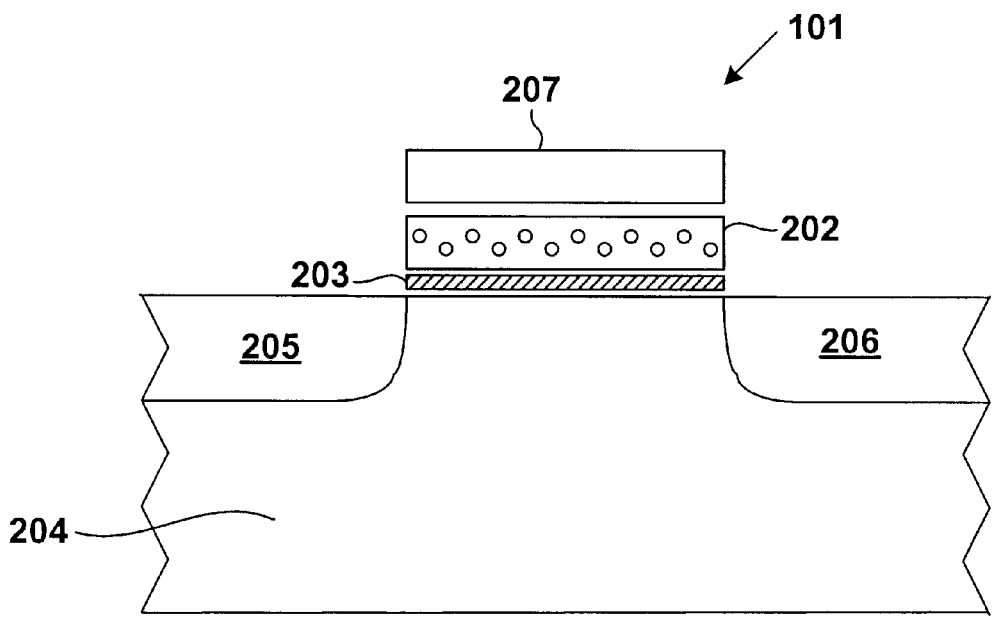
FIG. 2b is a cross-section view of a memory transistor with a floating gate.

FIGS. 2a and 2b show an example of a typical configuration for a conventional floating gate flash memory cell 200. The flash memory cell 200 includes a memory transistor 101 having a p-well 204, a source 205, a drain 206, a gate 207, and a floating gate 202 structure. A thin insulating film 203 is located between the floating gate 202 and the p-well 204. The memory transistor 101 is characterized by a variable threshold voltage ("$V_t$"). The transistor can be programmed, having a higher $V_t$ or erased, having a lower $V_t$. In general, the memory cell is programmed by causing injection of electrons into the floating gate 202. The memory cell is erased by causing evacuation of electrons from the floating gate 202. The Excess electrons increase the transistor's $V_t$, while evacuation of electrons away from the floating gate 202 decreases the $V_t$.

The erasure of a memory cell 200 is caused by a process by which an erase voltage $V_e$ is applied to a sector of memory transistors 101, causing electrons to evacuate the floating gate 202. The erase voltage $V_e$ is applied for a sufficient time to cause $V_t$ for the memory transistors 101 in the erased sector to be decreased below that of the voltage $V_r$ applied to the transistor to read data. In the erased state, current can flow through the transistor when $V_r$ is applied. A memory cell 200 represents a logical "1" when the memory cell 200 is accessed for reading.

In one embodiment, the erase voltage $V_e$ is applied between the p-well 204 and the gate 207. By way of example, a voltage pulse having a magnitude of approximately 10V is applied to the p-well 204 while a voltage pulse of –10V is applied to the gate 207. The high potential will evacuate electrons from the floating gate 202 and thus lower the $V_t$ of the memory cell. Those skilled in the art will recognize that the transistor 101 can be erased with alternate biasing schemes such as a gate to source voltage. Subsequent to the application of the erase voltage $V_e$, a cycle commonly called a verify cycle occurs in which it is determined whether the selected transistors 101 have a $V_t$ not greater than a selected voltage level, known as an erase-verify voltage $V_{ev}$. The erase cycle is repeated when it is determined that a transistor has $V_t$ greater than $V_{ev}$. The erase and verify cycles are repeated until it is verified that none of the selected memory cells have a $V_t$ greater than $V_{ev}$.

One method for programming of the memory cell 200 occurs by electrically biasing the memory transistor 101 for a sufficient time to cause injection of electrons into the floating gate 202 and thereby causing $V_t$ to increase sufficiently greater than $V_r$. Thus, a programmed transistor will not conduct substantial current during a read cycle because $V_r$ is not sufficient greater than the transistor's programmed $V_t$ to turn the memory transistor 101 on. In a preferred embodiment, the absence of current during a read cycle represents logical value "0."

During programming, a voltage, $V_p$, is typically applied to the gates of the transistors 101 and a voltage $V_d$ is applied to the drains, while the substrate and sources are grounded. By way of example, a +5.0V voltage is applied to the drain 206 while a 9.0 V pulse is applied to the gate 207. Program biasing may also include applying a voltage to the substrate 204 and/or the source 205. The voltage $V_p$ may comprise a single voltage pulse or a series of voltage pulses. After application of $V_p$, a program-verify cycle occurs. Verification is needed because of variation in program speeds. The verification cycle guarantees that each cell is at a desired $V_t$ state.

Soft-programming is a variation of programming in which the transistors 101 are partially programmed. In soft-programming, $V_t$ is increased less relative to increases in $V_t$ during programming, by causing fewer electrons to be injected into the floating gate 202. In particular, a soft-programming voltage $V_{sp}$, which is less than $V_p$, can be applied to the transistor 101 to raise $V_t$ slightly relative to increases during programming. Those skilled in the art will recognize that the transistor 101 can be soft-programmed by applying $V_{sp}$, using the method described above, or by other known methods to partially program $V_t$.

Physical variations in each memory transistor 101 for example channel length, channel width, doping concentrations, and operating temperature, affect the speed at which the transistor 101 can be erased. Thus, the time to erase a transistor 101 to a desired $V_t$ also varies. By way of example, fast transistors 101 may achieve a desired $V_t$ level in 50 erase pulses while slow transistors may require 100 pulses to achieve the same $V_t$. Because the erase voltage $V_e$ applied to the transistors 101 is generally constant for each transistor, the $V_t$ for the erased transistors will vary. Fast erase transistors will have a lower $V_t$ than a slower transistor, with all transistors verified as having a $V_t$ not greater than the $V_{ev}$.

Figure 3:
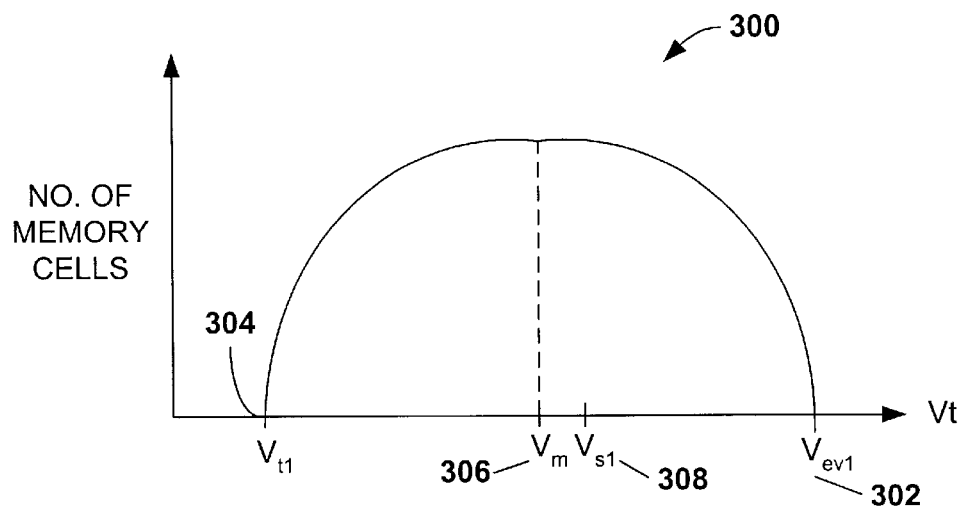
FIG. 3 is a graphical illustration showing a conventional threshold voltage distribution for erased memory cells in a non-volatile flash memory design.

FIG. 3 illustrates a graphical representation for a typical $V_t$ distribution 300 for a conventionally erased flash memory array. In this example, each transistor is verified as having a $V_t$ not greater than a first erase-verify voltage ("$V_{ev1}$") 302. In a preferred embodiment, $V_{ev1}$ 302 is substantially equal to or less than 2.4V. A least erased memory cell, will have a $V_t$ approximately equal to $V_{ev1}$ 302, a most erased memory cell will have a $V_t$ approximately equal to a low threshold voltage ("$V_{t1}$") 304 and typical memory cells will have a $V_t$ approximately equal to a median erased threshold voltage ("$V_m$") 306. Fast memory cells will generally have a $V_t$ between $V_m$ and $V_{t1}$, while slow memory cells will generally have a $V_t$ between $V_m$ 306 $V_{ev1}$ 302.

In a preferred embodiment, memory cells verified having a $V_t$ less than or equal to a selected reference voltage ("$V_{s1}$") 308 are soft-programmed. It is preferred that $V_{s1}$ 308 is approximately equal to $V_m$ 306. It is more preferred that $V_{s1}$ 308 is within a range of 100 mV to 500 mV less than $V_{ev1}$ 302, so that the slow-erase memory cells do not receive soft-programming. The circuitry that is electrically coupled to the flash memory array enabling soft-programming as shown in FIG. 1, is configured to selectively soft-program the memory transistors 101 by precluding soft-programming of memory transistors 101 having a $V_t$ greater than $V_{s1}$ and applying soft-programming pulses $V_{sp}$ to memory transistors having a $V_t$ not greater than a selected reference voltage $V_{s1}$ 308. After the memory transistors 101 are soft-programmed, each memory cell is verified as having a $V_t$ not less than $V_{s1}$ 308. The memory transistors 101 are selectively soft-programmed until each memory transistor 101 has a $V_t$ not less than $V_{s1}$ 308.

Figure 4:
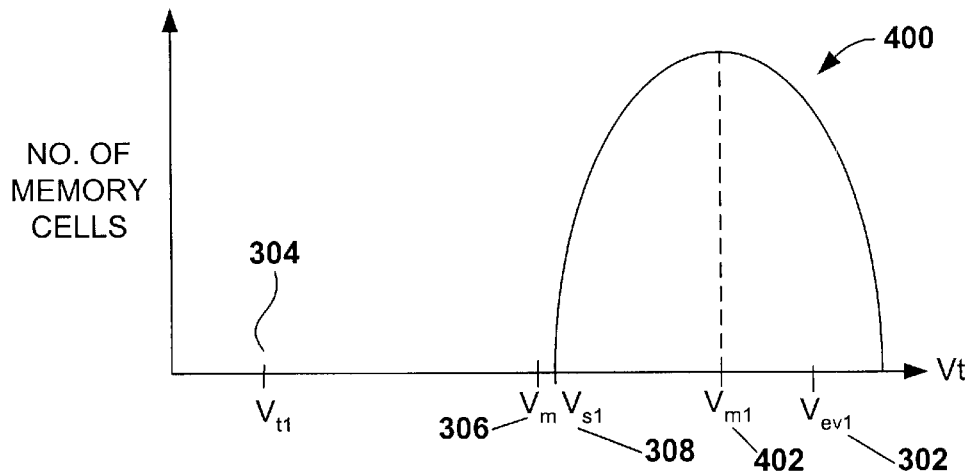
FIG. 4 is a graphical illustration showing a threshold voltage distribution for a non-volatile flash memory design subsequent to selectively soft-programming.

FIG. 4 illustrates a graphical representation for a $V_t$ distribution 400 for a flash memory array that has been selectively soft-programmed. The soft-program distribution 400 shown illustrates that each memory cell has a $V_t$ not less than $V_{s1}$ 308. After soft-programming, a most erased memory cell in the soft-programmed distribution 400 will have a $V_t$ approximately equal $V_{s1}$ 308, which is greater than the $V_t$ of the most erased memory cell of the conventionally erased flash memory $V_{t1}$ 304. Typical soft-programmed cells have a $V_t$ approximately equal to a median soft-programmed threshold voltage $V_{m1}$ 402, which is greater than the median erased threshold voltage for a typical flash memory array $V_m$ 306. Because the $V_t$ for fast-erase memory cells was increased, some memory cells in the soft-program distribution may have a $V_t$ greater than $V_{ev1}$ 302.

Figure 5:
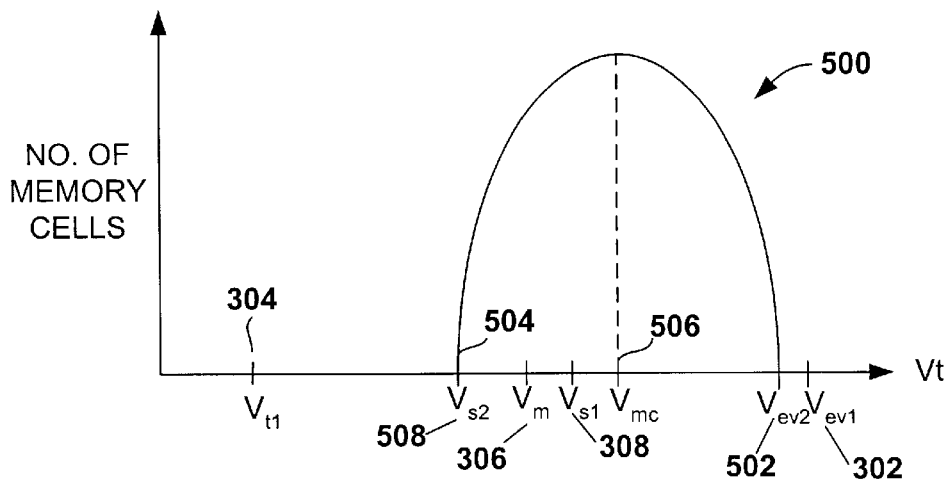
FIG. 5 is a graphical illustration showing a compacted threshold voltage distribution for a non-volatile flash memory design.

After selectively soft-programming, the memory transistors 101 are subsequently erased in accordance with known methods and circuitry. During the subsequent erasing, the memory transistors 101 are verified to have a $V_t$ not greater than a second erase-verify voltage ("$V_{ev2}$") 502. FIG. 5 illustrates a graphical representation for a compact threshold voltage distribution 500 for a flash memory array that has been erased subsequent to soft-programming. In a preferred embodiment for the compact threshold voltage distribution 500, the $V_t$ for a most erased memory cell 504 has a greater threshold voltage than $V_{t1}$ 304 for the most erased memory cell of a conventionally erased flash memory array. The compact threshold voltage distribution 500 has a median threshold voltage ("$V_{mc}$") 506 which has a greater voltage than the median threshold voltage $V_m$ 306 and each memory transistor 101 is verified having a $V_t$ not greater than $V_{ev2}$ 502. It is preferred that, $V_{ev2}$ is substantially equal to or less than $V_{ev1}$. It is further preferred that $V_{ev2}$ is substantially equal to or less than 2.1V. Selective soft-programming may be repeated for memory transistors 101 verified having $V_t$ less than a second selected reference voltage ("$V_{s2}$") 508 subsequent to the soft-programming. It is preferred that $V_{s2}$ has a value not less than the minimal acceptable $V_t$ for the memory array.

Figure 6:
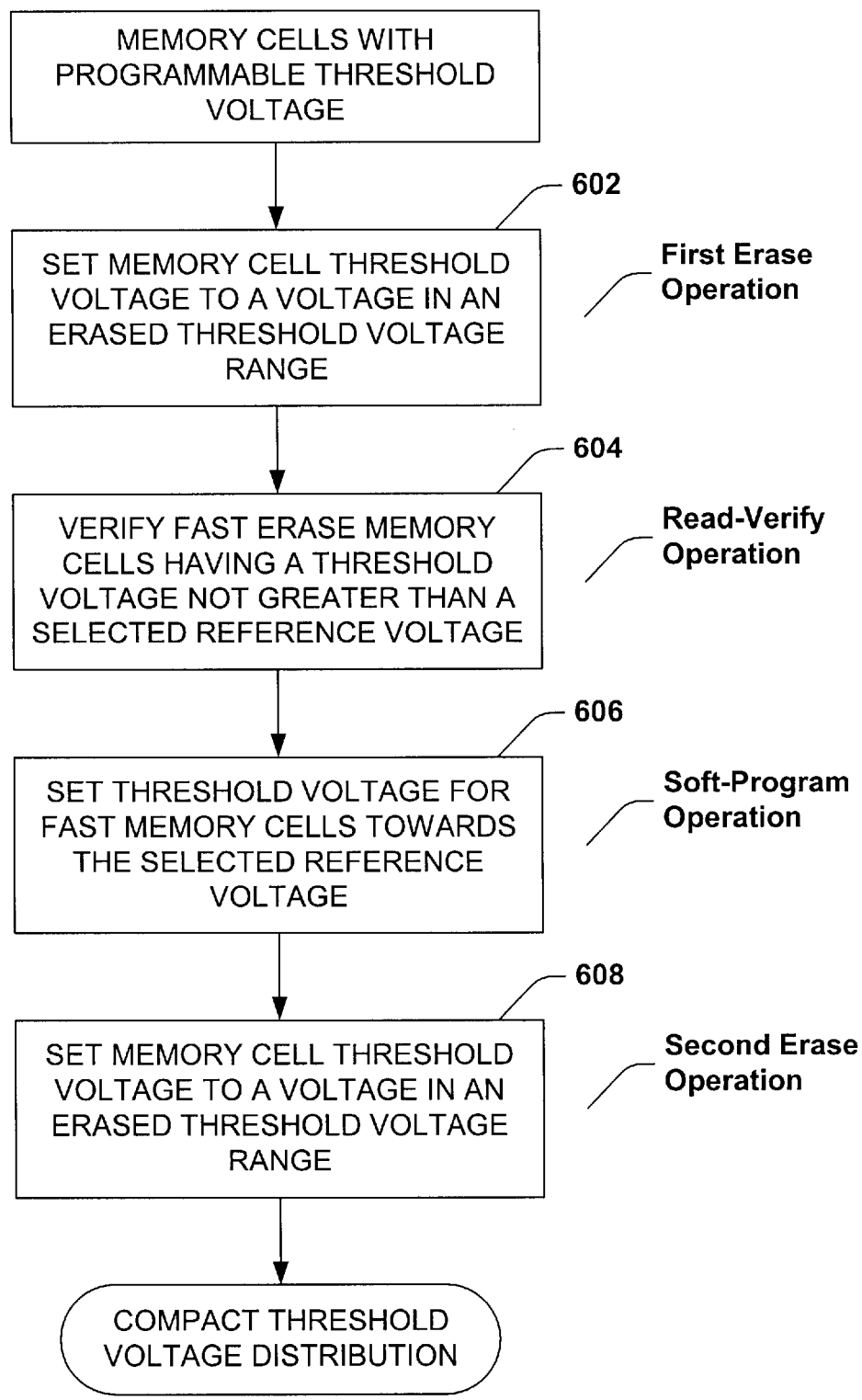
FIG. 6 is a graphical flowchart for a one embodiment of a method for compacting a threshold voltage distribution.

FIG. 6 illustrates a flowchart for preferred embodiment comprising a method for compacting a threshold voltage distribution for non-volatile semiconductor memory designs. In particular, FIG. 6 illustrates a flowchart 600 for a method for compacting the threshold voltage distribution for a flash memory device having a plurality of memory cells, each having a storage element characterized by a programmable threshold voltage range. The programmable threshold voltage range is partitioned in at least two threshold voltage ranges: 1) an erased threshold voltage range; and 2) at least one programmed threshold voltage range. The illustrated embodiment comprises a first erase operation 602, a read-verify operation 604, a soft-program operation 606, and a second erase operation subsequent to the soft-program operation 608.

The first erase operation 602 comprises setting the $V_t$ for the plurality of memory cells substantially towards a median erased threshold voltage $V_m$ in the erased threshold voltage range. In a preferred embodiment, the erased threshold voltage range comprises a range of voltages less a first erase-verify voltage $V_{ev1}$ and the erasing operation comprises setting the $V_t$ of memory cells less than $V_{ev1}$.

The read-verify operation 604 selects fast-erase memory cells to be soft-programmed. In a preferred embodiment, at least one verified fast-erase memory cell is characterized as having a $V_t$ substantially less than a selected reference voltage. In the soft-program operation 606, at least one soft-program voltage pulse is applied to the at least one fast-erase memory cells to set the $V_t$ towards the selected reference voltage. In a preferred embodiment, soft-programming operation 606 comprises increasing the $V_t$ for the at least one fast-erase memory cell to a voltage greater than the selected reference voltage. It is preferred that selected reference voltage is approximately equal to $V_m$. It is more preferred that the selected reference voltage be within a range of 100 mV to 500 mV less than the $V_{ev1}$.

The second erase operation 608 sets the $V_t$ of the plurality of memory cells and the at least one fast-erase memory cell substantially towards a compact median erased threshold voltage in the erased threshold voltage range. In a preferred embodiment, the second erase operation comprises setting the $V_t$ for the memory cells to a value less than a second erase-verify voltage $V_{ev2}$, which is less than or substantially equal to $V_{ev1}$. The soft-programming operation 606 may be repeated for memory cells verified as having a $V_t$ less than a second selected reference voltage. It is preferred that the second selected reference voltage is substantially equal to the minimum acceptable $V_t$ for the memory array.

As heretofore mentioned, in accordance with the principles of the present invention, a device having a compact $V_t$ distribution without increasing the $V_t$ for the least erased memory cell above an erase-verify voltage and a method for compacting an erased $V_t$ distribution without increasing the least erased memory cells can be obtained. A device of the present invention will exhibit less column leakage current than a conventionally erased flash memory array and is particularly suited for flash memory cells exhibiting short channel behavior, and having a low erase verify voltage.

While particular embodiments of the present invention have been shown and described, modifications may be made. It is therefore intended in the appended claims to cover all such changes and modifications that fall within the true spirit and scope of the invention.

What is claimed is:

1. A method for compacting a threshold voltage distribution for a non-volatile semiconductor memory design having a plurality of memory cells each having a programmable threshold voltage, the method comprising the acts of:

(a) erasing the plurality of memory cells wherein memory cells are set to have a threshold voltage not greater than a first erase-verify voltage, the memory cells collectively have a threshold voltage distribution centered substantially about a threshold voltage for a typical memory cell;

(b) selectively soft-programming the plurality of memory cells wherein the threshold voltage for fast-erase memory cells having a threshold voltage not greater than a selected reference voltage are set to a threshold voltage not less than the selected reference voltage, the selected reference voltage less than the erase-verify voltage; and (c) subsequent to selectively soft-programming, erasing the plurality of memory cells wherein memory cells are set to have a threshold voltage not greater than a second erase-verify voltage.

2. The method of claim 1, wherein selectively soft-programming the plurality of memory cells comprises:

(i) reading the plurality of memory cells to verify fast-erase memory cells, the fast erase memory cells having a threshold voltage less than the selected reference voltage; and (ii) applying at least one soft-program voltage pulse to fast erase memory cells, the soft-program pulse capable of programming the fast erase memory cells to a threshold voltage not less than the selected reference voltage.

3. The method of claim 2 further comprising the act of soft-programming memory cells verified as having a $V_t$ less than a second selected reference voltage.

4. A method for erasing a non-volatile semiconductor memory device having a plurality of memory cells each memory cell including a memory storage element characterized by a programmable threshold voltage and the memory storage element having an erased threshold voltage range and at least one programmed threshold voltage range, the method comprising:

(a) a first erase operation wherein the threshold voltage for the plurality of memory cells are set substantially towards a median erased threshold voltage, the median erased threshold voltage in the erased threshold voltage range;

(b) a read-verify operation wherein at least one fast-erase memory cells is verified;

(c) a soft-program operation wherein at least one soft-program pulse is applied to the at least one verified fast erase memory cell setting the threshold voltage for the at least one verified fast-erase memory cell towards the programmed threshold voltage range; and (d) a second erase operation subsequent to the soft-program operation wherein the threshold voltage for the plurality of memory cells and the at least one verified fast-erase memory cell are set substantially towards a compact median erased threshold voltage in the erased threshold voltage range.

5. The method of claim 4 wherein the first erase operation comprises setting the threshold voltage for the plurality of memory cells to a voltage less than a first erase-verify voltage; the read-verify operation comprises verifying memory cells with a threshold voltage less than a selected reference voltage, the selected reference voltage less than the erase-verify voltage; the soft-program operation comprises setting the threshold voltage for the verified memory cells to a voltage greater than the selected reference voltage; and the second erase operation comprises setting the threshold voltage for the plurality of memory cells to a value less than a second erase-verify voltage.

6. The method of claim 5 wherein the select reference voltage is substantially equal to the median erased threshold voltage and the second erase-verify voltage is less than the first erase-verify voltage.

7. The method of claim 6, wherein the non-volatile semiconductor memory device is a flash memory design.

8. A non-volatile semiconductor memory device, comprising:

(a) a plurality of memory cells, each memory cell having a variable threshold voltage and configured to electronically store data by setting the threshold voltage to one of two threshold voltage ranges including an erased range and a programmed range;

(b) an erase circuit electrically coupled to the plurality of memory cells and configured to set the threshold voltage for a plurality of memory cell towards a median erased threshold voltage within the erased range, the median erased threshold voltage being less than an erase-verify voltage;

(c) a read-verify circuit electrically coupled to the plurality of memory cells and configured to verify an erased memory cell having a threshold voltage less than a selected reference voltage;

(d) a soft-program circuit electrically coupled to the plurality of memory cells and configured to soft-program the verified memory cell and thereby setting the threshold voltage of the verified memory cell towards the erase-verify voltage; and (e) a compact-erase circuit electrically coupled to the plurality of memory cells and configured to set the threshold voltage of at least a soft-programmed memory cell to a value less than the erase-verify voltage.

9. The device of claim 8 wherein the soft-program circuit is configured to soft-program a plurality of erased memory cells having a threshold voltage less than a selected reference voltage, the compact-erase circuit is configured to set the threshold voltage for a plurality of memory cells towards a threshold voltage less than the erase-verify voltage.

10. The device of claim 9 wherein the erase circuit coincides with the compact-erase circuit and the selected reference voltage is substantially equal to the median erased threshold voltage.

* * * * *